US006461794B1

(12) United States Patent
Horne

(10) Patent No.: US 6,461,794 B1
(45) Date of Patent: Oct. 8, 2002

(54) LITHOGRAPHIC PRINTING FORMS

(75) Inventor: Geoff Horne, Leeds (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/371,977

(22) Filed: Aug. 11, 1999

(51) Int. Cl.$^7$ .................................................. G03F 7/30

(52) U.S. Cl. .................... 430/302; 430/286.1; 430/944; 430/935; 430/945; 430/18

(58) Field of Search ................................ 430/18, 278.1, 430/281.1, 286.1, 302, 905, 926, 944, 945, 935

(56) References Cited

U.S. PATENT DOCUMENTS

| | | | | |
|---|---|---|---|---|
| 3,645,733 A | | 2/1972 | Brinckman et al. | |
| 4,266,006 A | * | 5/1981 | Uhlig et al. | 430/300 |
| 4,355,096 A | * | 10/1982 | Walls | 430/302 |
| 4,439,511 A | * | 3/1984 | Stahlhofen | 430/165 |
| 4,500,617 A | * | 2/1985 | Nakayama | 430/49 |
| 4,502,925 A | * | 3/1985 | Walls | 204/33 |
| 4,517,275 A | * | 5/1985 | Stahohfen | 430/165 |
| 5,039,592 A | * | 8/1991 | Umeda | 430/271.1 |
| 5,200,292 A | | 4/1993 | Shinozaki et al. | 430/178 |
| 5,202,221 A | * | 4/1993 | Imai et al. | 430/283.1 |
| 6,090,532 A | * | 7/2000 | West et al. | 430/326 |
| 6,130,026 A | * | 10/2000 | Bennett et al. | 430/303 |
| 6,138,567 A | * | 10/2000 | Ray et al. | 101/463.1 |
| 6,165,679 A | * | 12/2000 | Van Damme et al. | 430/270.1 |

FOREIGN PATENT DOCUMENTS

| | | |
|---|---|---|
| GB | 1245924 | 9/1967 |
| WO | WO9739894 | 10/1997 |
| WO | WO9901795 | 1/1999 |
| WO | WO9901796 | 1/1999 |
| WO | WO9921715 | 5/1999 |

OTHER PUBLICATIONS

"The Surface Treatment of Finishing of Aluminum and its Alloys", S. Wernick, 5$^{th}$ Edition, ISBN 0-904477-09-6 pp 184-189 (1987).

* cited by examiner

*Primary Examiner*—Janet Baxter
*Assistant Examiner*—Yvette M. Clarke
(74) *Attorney, Agent, or Firm*—Baker Botts L.L.P.

(57) ABSTRACT

A lithographic printing form precursor comprises an imagable coating on a roughened and anodized aluminum support. The precursor is prepared by a process comprising:

(a) anodising an aluminum sheet; and (b) without having effected a chemical treatment step after the anodising step, applying a composition comprising a polymeric substance to the anodised surface of the aluminum sheet and drying the composition to form the imagable coating thereon, wherein the coating contains a pigment and does not contain a dye.

Undesired staining of the lithographic printing form during development is avoided by using the precursor in the lithographic printing process.

18 Claims, 1 Drawing Sheet

LITHOGRAPHIC PRINTING FORMS

BACKGROUND OF INVENTION

This invention relates to lithographic printing forms and to precursors thereto, having aluminum supports bearing imagable coatings. The invention relates further to the manufacture of such precursors, and their use.

Typical lithographic printing form precursors are prepared as follows.

An aluminum sheet is subjected to a graining or roughening treatment. This may be a mechanical graining treatment, for example brush graining or ball graining, or an electrograining treatment (also called electrochemical etching or electrochemical roughening) in a mineral acid. The sheet is then anodised, to provide a hard hydrophilic surface, which has a microporous "honeycomb" structure. Anodising may typically take place in a sulphuric acid or phosphoric acid electrolyte. A post-anodic treatment (PAT) is then carried out, using, for example, a silicate or a phosphate composition. Subsequently a different composition, containing a polymeric substance, is applied in a liquid form, a solvent being removed therefrom to leave the imagable coating as a dry film on the aluminum sheet, which may be cut into individual lithographic printing form precursors. The resultant precursors may be imaged and developed, to provide the lithographic printing forms which are used for printing. During development, portions of the coating are selectively removed. In positive working systems portions which were exposed are removed. In negative working systems portions which were not exposed are removed. In most systems, whether positive or negative, the remaining portions of the coating are preferentially ink-accepting.

Many coatings contain dyes and these may be employed for several distinct reasons. A dye may alter the properties of the polymeric substance, for example by rendering it insoluble in a developer, but such that after imaging, the coating is soluble in the developer. Examples of such dyes are given in WO 97/39894, incorporated herein by reference. A dye may function as an absorber of imaging radiation, either as a "spectral sensitizer" to emit radiation of a different wavelength which triggers a desired chemical reaction to alter the properties of the coating, or as a compound which converts the absorbed radiation to heat, which alters the properties of the coating. Examples of dyes functioning as spectral sensitizers are given, for example, in U.S. Pat. No. 5,200,292, incorporated herein by reference. Examples of dyes converting imaging radiation to heat are given, in PCT/GB97/39894. Additionally, a dye colors a coating such that after development a positive or negative image can be seen on the printing plate. From this the printer can gain an impression of whether imaging and development has been successful and can identify and correct faults.

If the PAT step is not carried out any dye present in the coating may be seen in the regions from which the portions of the coating are removed on development; the dye may form an absorbed or residual layer on the anodised surface. This is undesirable as it reduces the contrast between exposed and unexposed portions of the printing plates and makes it harder for the printer to determine whether imaging and development has been successful, and to identify and correct faults. Furthermore dye which is present in uncoated areas may attract ink and cause poor printing performance.

It has also found that when a pigment is present rather than a dye, it is not necessary to effect a PAT step.

SUMMARY OF THE INVENTION

This invention is directed to a method of preparing a lithographic printing form precursor having an imagable coating on an aluminum support, the method comprising:

i. anodising an aluminum sheet (which is to serve as the support); and ii. without having effected a chemical treatment step after the anodizing step, applying a composition comprising a polymeric substance to the anodised surface of the aluminum sheet and drying the composition to form the imagable coating thereon, wherein the coating contains a pigment and does not contain a dye.

This invention is also directed to a lithographic printing form precursor prepared by the above-described method, a method of making a lithographic printing form which comprises imaging and developing such a precursor, and a lithographic printing form obtained by imaging and developing such a precursor.

DETAILED DESCRIPTION OF THE INVENTION

Figure 1:
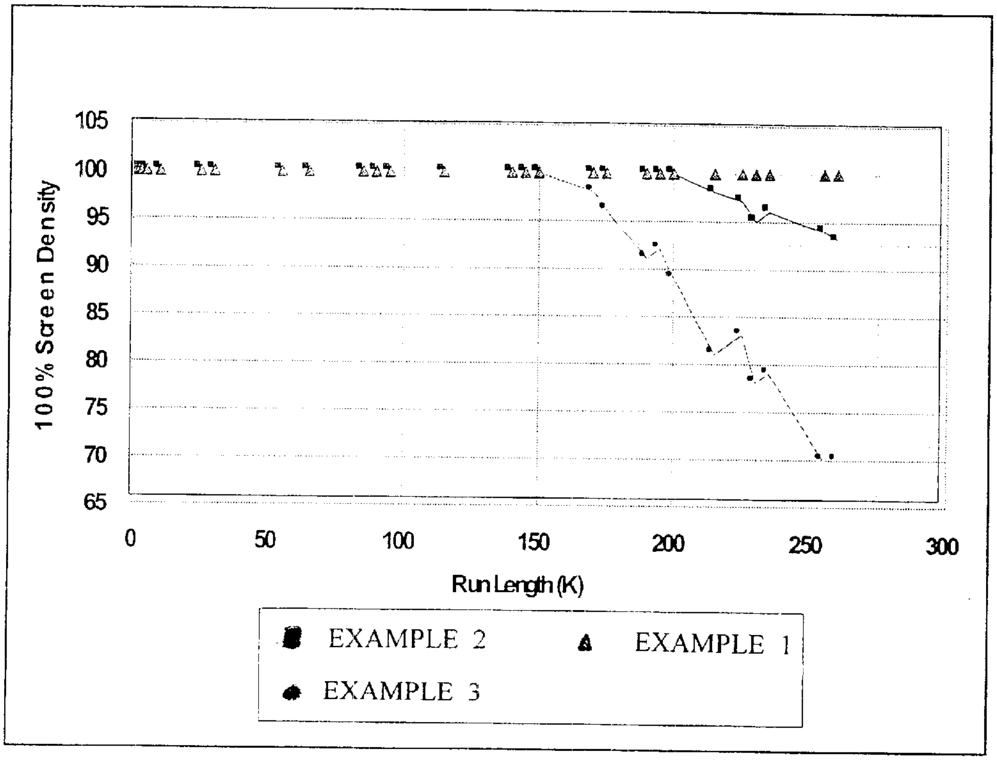
FIG. 1 sets forth the results of density tests at various run lengths for the compositions of Examples 1–3.

Pigments as defined herein are insoluble in the compositions and so comprise colorant particles therein, and in the dried coatings. Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they have no or insignificant effect on the solubility of the unheated coatings in the developer. However some pigments may dissolve or break down in a developer and such pigments are within the ambit of the present invention provided that they do not thereby produce a colored solution which would cause staining.

In contrast to pigments, dyes as defined herein are colored materials which are soluble in the compositions. As described in WO 97/39894 many dyes have a marked effect on the solubility of the unimaged composition in the developer, typically making it much less soluble. Currently there is much interest in infra-red (IR) absorbing dyes. Examples are described in WO 97/39894. Generally these are narrow band absorbers, typically able to efficiently absorb electromagnetic radiation and convert it to heat only over a range of wavelengths typically not exceeding 100 run, and so they have to be selected having regard to the wavelength of the radiation which is to be used for imaging (although black dyes may be broad band absorbers).

Suitably the pigment constitutes at least 0.25%, preferably at least 0.5%, more preferably at least 1%, and most preferably at least 2%, of the total weight of the coating.

Suitably the pigment constitutes up to 25%, preferably up to 20%, and most preferably up to 15%, of the total weight of the coating.

References herein to the proportion of pigment are to their total content, when more than one pigment is employed.

Thus, it has been found in this invention that when a pigment is employed, instead of a dye, with the pigment staying in particulate form during development, or dissolving or breaking down to form a colorless solution during development, staining of the lithographic printing form does not occur.

The term "aluminum" as used herein includes aluminum alloys.

Preferably both sides of the aluminum sheet are anodised, to reduce the risk of corrosion attack in the developer.

Preferably a graining step is carried out prior to the anodising step, for example mechanical graining or electrograining, as described briefly above. Preferably electrograining is carried out. The anodising step which follows may suitably take place in a phosphoric acid or, especially, a sulphuric acid electrolyte. The technology of graining and anodising is very well known, as described, for example, in "The Surface Treatment and Finishing of Aluminum and its Alloys", S. Wernick et al, 5th edition; 1987, ISBN 0-904477-09-6, pp 184–189, incorporated herein by reference.

As well as avoiding staining and removing a manufacturing step it has been found that printing forms made by the method of this invention have longer run lengths than similar printing forms which have had a chemical treatment step between the anodising step and the application of the composition which on drying forms the imagable coating.

A precursor made by a method in accordance with this invention may have a coating formed as a single layer or as two, or more, layers.

In accordance with the examples herein good results have been obtained with positive working compositions, but a precursor made by a method in accordance with this invention may be positive working, or negative working.

Examples of suitable polymeric substances may be selected from phenolic resins; polymers of styrenes, for example 4-hydroxystyrene, 3-methyl-4-hydroxystyrene and 4-methoxystyrene, acrylic acids including methacrylic acid and acrylic acid, maleiimide, maleic acid and maleic acid anhydride; in each case, as homopolymers, co-polymers or terpolymers.

Most preferably the polymeric substance is a phenolic resin. Particularly useful phenolic resins are condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis (4-hydroxyphenyl) propane, and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde: phenol ratio between 0.5:1 and 1: 1, preferably 0.5:1 to 0.8:1 and an acid catalyst is used to prepare those phenolic resins generally known as novolaks which are thermoplastic in character. Examples of suitable novolak resins have the following general structure

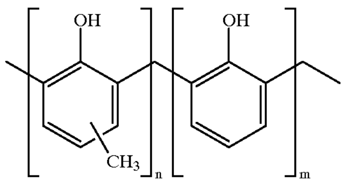

Higher aldehyde:phenol ratios of more then 1:1 to 3:1, and a basic catalyst give rise to a class of phenolic resins known as resoles, and these are characterised by their ability to be thermally hardened at elevated temperatures.

Preferably the pigment is a material which can absorb infra-red radiation and convert it to heat. Examples include carbon pigments (for example the grades available as carbon black, lamp black, furnace black and channel black), black iron (III) oxide, manganese oxide, MILORI BLUE (C.I. Pigment Blue 27) available from Aldrich, PARIS BLUE available from Kremer, PRUSSIAN BLUE, HELIOGEN GREEN available from BASF and NIGROSINE BASE NG1 available from NH Laboratories. However pigments which are not infra-red absorbers may be used for their colorant property, in precursors which are not intended for infra-red imaging. An example is copper phthalocyanine.

The coating may comprise a component which renders the polymeric substance less soluble in a developer, but such that upon imaging, the polymeric substance may where imaged be readily removed by the developer. The solubility inhibiting component may be a compound separate from the polymeric substance provided that the solubility inhibiting component meets the requirements defined above, or the solubility inhibiting component may be present by functionalisation of the polymeric substance. For example a polymeric substance may be functionalised by orthoquinone diazide groups, especially 1,2-naphthoquinone diazide groups, for example as described in WO 99/01796, or may be functionalised by groups described in WO 99/01795, both of which are incorporated herein by reference.

However suitable coatings include those containing only a polymeric substance and a pigment.

Preferably in a method of the invention which uses a positive working coating, the coating is such that it is imagewise solubilized by heat.

Preferably in a method of the invention which uses a negative working coating, the coating is such that it is imagewise insolubilized by heat.

In certain embodiments of the invention heat is imagewise delivered conductively to the coating, by direct application. For example the coating may be contacted by a heat stylus; or the reverse face of the support surface bearing the coating may be contacted by a heat stylus.

In other embodiments of the invention electromagnetic radiation is preferably used to image the coating, the wavelength thereof preferably entirely or predominantly exceeding 500 nm. Preferably, it is of wavelength entirely or predominantly exceeding 600 nm. More preferably it is of wavelength entirely or predominantly exceeding 700 nm. Most preferably it is of wavelength entirely or predominantly exceeding 800 nm. Suitably it is of wavelength entirely or predominantly below 1400 nm. More preferably it is of wavelength entirely or predominantly below 1200 nm. Most preferably it is of wavelength entirely or predominantly below 1100 nm. Thus, suitably it is of wavelength entirely or predominantly in the range 600 to 1400 nm, more preferably 700 to 1200 nm, most preferably 800 to 1100 nm. The electromagnetic radiation is converted to heat by the pigment. Electromagnetic radiation is preferably delivered by a laser under digital control.

In this specification when it is stated that a coating is developer soluble it is meant that it is soluble in a developer, to an extent useful in a lithographic printing form development process. When it is stated that a coating is developer insoluble it is meant that the coating is not soluble in a developer, to an extent useful in a lithographic printing form development process.

The developer composition is dependent on the nature of the components of the composition, but is preferably an aqueous composition. Common components of aqueous developers are surfactants, chelating agents such as salts or ethylenediamine tetraacetic acid, organic solvents such as benzyl alcohol, and alkaline components such as inorganic metasilicates, organic metasilicates, hydroxides or bicarbonates.

Preferably the aqueous developer is an alkaline developer containing inorganic or organic metasilicates when the polymeric substance, as is preferred, is a phenolic resin.

It has been found that by carrying out a suitable heat treatment in accordance with the invention of WO 99/21715, the contents of which are hereinafter incorporated by reference, the performance of the coating may be improved, in particular rendered more consistent over time. Such a heat treatment is preferably carried out at a temperature of at least 40° C., more preferably at least 50° C., most preferably at least 60° C. As regards the upper limit, as a guide it is preferred to use a temperature not in excess of 90° C., preferably not in excess of 80° C., most preferably not in excess of 70° C. Temperatures in the range 60–70° C. are particularly preferred. Generally, the lower the temperature for the heat treatment, the longer the time should be. In all cases however carrying out the heat treatment for at least 4 hours is preferred; and more preferably for at least 24 hours and most preferably for at least 48 hours.

Preferably the sensitivity of the preferred coating of the precursors produced by the method of the invention is at a practicable level; suitably no more than 400 $mJcm^{-2}$, preferably no more than 250 $mJcm^{-2}$. A heat treatment as discussed above may be of assistance in achieving this.

In accordance with a second aspect of the invention there is provided a printing form precursor made by a method as defined herein.

In accordance with a third aspect of the invention there is provided a method of making a printing form by imaging and developing the printing form precursor of the second aspect.

In accordance with a fourth aspect there is provided such a printing form, per se.

Preferably the printing form of the fourth aspect is used in a printing process without having undergone a post-development baking step. A post-development baking step can be carried out to obtain a substantial increase in run length achievable with a given printing form. However many customers do not want to, or cannot, subject their imaged and developed printing forms to a baking step but prefer instead to purchase precursors which can be used straight after development, that is, precursors which offer run lengths which are adequate without a post-development baking step.

The following examples more particularly serve to illustrate the various aspects of the present invention described hereinabove.

The following products are referred to hereafter:

Resin A—LB6564, a 1:1 phenol/cresol novolak resin supplied by Bakelite, UK.

Resin B—LB744, a cresol novolak resin supplied by Bakelite.

PARIS BLUE, a blue pigment supplied by Kremer Pigmente, of Aichstetten, Germany.

CARBON BLACK FW2—a channel type carbon black supplied by Degussa of Macclesfield, UK.

Dye A—KF654B PINA as supplied by Riedel de Haan UK, Middlesex, UK, believed to have the structure:

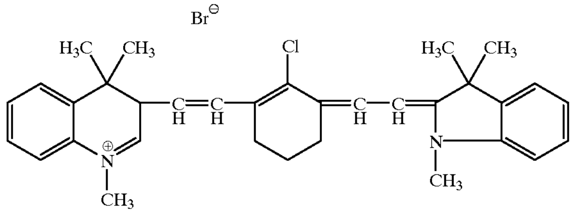

Dye B—crystal violet (basic violet 3, C.I. 42555, Gentian Violet) as supplied by Aldrich Chemical Company, Dorset, UK, having the structure:

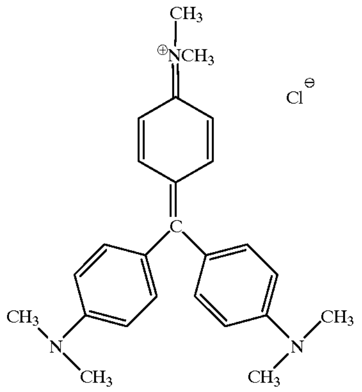

SILIKOPHEN P50X—a phenyl methyl siloxane as supplied by Tego Chemie Service GmbH of Essen, Germany.

Developer A—4% wt sodium metasilicate pentahydrate in water.

Substrate A—0.3 mm thickness sheet aluminum, electrograined in hydrochloric acid and anodised in sulphuric acid, on both sides.

Substrate B—0.3 mm sheet aluminum, electrograined in hydrochloric acid and anodised in sulphuric acid, on both sides, and post-anodically treated with an aqueous solution of an inorganic phosphate.

CREO TRENDSETTER 3244—a commercially available plate setter, using Procomm Plus Software, operating at a wavelength of 830 nm and supplied by Creo Products Inc. of Burnaby, Canada.

Kodak Polychrome Graphics Mercury Mark V Processor—a commercially available processor as supplied by Kodak Polychrome Graphics, Leeds, UK.

Example 1

CARBON BLACK FW2 and Resin B (at a ratio of 1:4, w:w) were ball milled together for 5 days such that the dispersed mill-base had a solids content of 30% w:w in 1-methoxy-2-propyl acetate and a sub-micron particle size. The mill-base was then added to Resin A and to further 1-methoxy-2-propyl acetate, such that the solids content was 18% w:w, to produce the coating solution. The coating solution was coated onto one side of Substrate A by means of a wire wound bar and dried at 110° C. for 90 seconds, to provide the specified dry film coating with a coating weight of 2.0 $gm^{-2}$. The printing form was then heat treated in an oven for 65° C. for 3 days.

Example 2

A printing form was prepared as in Example 1, except that the mill-base was PARIS BLUE and Resin A, at a ratio of 55:45 w:w and had a solids content of 40% w:w in the acetate solvent; and Resin B and further acetate were subsequently added.

Example 3 (comparative)

In this example a composition was prepared, of Resin A, Resin B, Dye A, Dye B and SILIKOPHEN P50X, in the acetate solvent. This was applied to Substrate B using wire wound bar and dried at 110° C. for 90 seconds, to give a dry film coating of 2.0 $gm^{-2}$; but was heat treated for 3 days at 55° C. The components of the dry coatings of Examples 1 to 3 are as set out in Table 1 below.

TABLE 1

| | Examples | | |
|---|---|---|---|
| Component | 1 | 2 | 3 (comparative) |
| Resin A | 10 | 28 | 70 |
| Resin B | 78 | 60 | 20 |
| Carbon Black FW2 | 12 | | |
| Paris Blue | | 12 | |
| Dye A | | | 2 |
| Dye B | | | 2 |
| Silikophen P50X | | | 6 |

Testing

The precursors were imaged in the CREO TRENDSETTER 3244, at a power of 10 watts and drum speed of 127 rpm, equating to an imaging energy of 200 $mJcm^{-2}$.

The exposed precursors were then processed using a Mercury Mark V processor containing Developer A at 22.5° C. at a process speed of 750 mm/min. It should be noted that the processor had previously been used for developing plates whose coatings contained blue dyes, and accordingly the developer was a strong blue color. No staining of any parts of the printing forms was observed. Thus, the pigment used did not deposit or remain in the areas from which coating was removed, nor did the dye contained in the developer so deposit.

The printing forms were press tested on a HEIDELBERG SPEEDMASTER 52 printing press, using DUO Laser 80 g paper, GIBBONS GENEVA A1 color ink and a standard fount solution comprising 88% water, 10% ISOSOL isopropyl alcohol and 2% GOLDFOUNT surfactants (trade marks). Each printing form ran cleanly, with no inking in background areas. Density tests were carried out on the solid image areas (100% screen density) at a range of run lengths. The results are shown in the graph shown in FIG. 1.

It will be seen that Example 1 maintained 100% screen density beyond 250,000 impressions; that Example 2 did so up to 200,000 impressions, and that Example 3 did so up to 150,000 impressions. Likewise, the following were the number of impressions at which wear on the printing forms themselves could be first seen:

Example 1 250,000

Example 2 200,000

Example 3 150,000

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiments. The invention extend to any one, or any combination, of the features disclosed in this specification (including any accompanying claims, abstract and drawings), or to any one, or any combination, of the steps of any method or process so disclosed.

I claim:

1. A method of preparing a lithographic printing form precursor having an imagable coating on an aluminum support, the method comprising:

(a) anodising an aluminum sheet; and (b) without having effected a chemical treatment step after the anodising step, applying a composition comprising a polymeric substance to the anodised surface of the aluminum sheet and drying the composition to form the imagable coating thereon, wherein the coating contains a pigment and does not contain a dye, and the coating is thereafter imagewise solubilized using heat.

2. The method of claim 1, wherein the pigment constitutes 0.25–25% of the total weight of the coating.

3. The method of claim 1, wherein the polymeric substance comprises a phenolic resin.

4. The method of claim 1, wherein the composition comprises a polymeric substance, a pigment, and a component which reduces the solubility of the polymeric substance in a developer, such that the polymeric substance becomes soluble in the developer in imaged areas.

5. The method of claim 1, wherein electromagnetic radiation is used to image the coating, and the electromagnetic radiation is converted to heat by the pigment.

6. The method of claim 5, wherein the radiation is in the range 600 to 1400 nm.

7. The method of claim 1, further including a heat treatment carried out on the support bearing the coating, at a temperature in the range 40–90° C. for at least 4 hours.

8. A lithographic printing form precursor prepared by a method comprising:

(a) anodising an aluminum sheet; and (b) without having effected a chemical treatment step after the anodising step, applying a composition comprising a polymeric substance to the anodised surface of the aluminum sheet and drying the composition to form the imagable coating thereon, wherein the coating contains a pigment and does not contain a dye, and the coating is thereafter imagewise solubized using heat.

9. A method of preparing a lithographic printing form, comprising:

(I) providing a lithographic printing form precursor prepared by a method comprising:

(a) anodising an aluminum sheet; and (b) without having effected a chemical treatment step after the anodising step, applying a composition comprising a polymeric substance to the anodised surface of the aluminum sheet and drying the composition to form the imagable coating thereon, wherein the coating contains a pigment and does not contain a dye; (II) imagewise solubilizing the coating using heat; and (III) developing the precursor.

10. A lithographic printing form prepared by a method comprising:

(i) preparing a lithographic printing form precursor by a method comprising:

(a) anodising an aluminum sheet, and (b) without having effected a chemical treatment step after the anodising step, applying a composition comprising a polymeric substance to the anodised surface of the aluminum sheet and drying the composition to form the imagable coating thereon, wherein the coating contains a pigment and does not contain a dye;

(ii) imagewise solubilizing the coating using heat; and (iii) developing the lithographic form precursor.

11. The form of claim 10, wherein the pigment constitutes 0.25–25% of the total weight of the coating.

12. The form of claim 10, wherein the polymeric substance comprises a phenolic resin.

13. The form of claim 10, wherein the composition comprises a polymeric substance, a pigment, and a component which reduces the solubility of the polymeric substance in a developer, such that the polymeric substance becomes soluble in the developer in imaged areas.

14. The form of claim 10, wherein electromagnetic radiation is used to image the coating, and the electromagnetic radiation is converted to heat by the pigment.

15. The form of claim 14, wherein the radiation is in the range 600 to 1400 nm.

16. The form of claim 10, further including a heat treatment carried out on the support bearing the coating, at a temperature in the range 40–90° C. for at least 4 hours.

17. A method of preparing a lithographic printing form precursor having an imageable coating on an aluminum support, the method comprising:

(a) anodising an aluminum sheet; and (b) without having effected a chemical treatment step after the anodising step, applying a composition which consists of a polymeric substance and a pigment to the anodised surface of the aluminum sheet and drying the composition to form the imageable coating thereon, wherein the coating contains a pigment and does not contain a dye, and the coating is thereafter imagewise solubilized using heat.

18. A lithographic printing form prepared by a method comprising:

(i) preparing a lithographic printing form precursor by a method comprising:

(a) anodising an aluminum sheet, and (b) without having effected a chemical treatment step after the anodising step, applying a composition which consists of polymeric substance and a pigment to the anodised surface of the aluminum sheet and drying the composition to form the imagable coating thereon, wherein the coating contains a pigment and does not contain a dye;

(ii) imagewise solubilizing the coating using heat; and (iii) developing the lithographic form precursor.

* * * * *